United States Patent
Lin

(10) Patent No.: US 9,354,110 B2
(45) Date of Patent: May 31, 2016

(54) PHOTO-ELECTRIC CONVERTING MODULE HAVING OPPOSITE CAVITIES

(71) Applicant: HON HAI PRECISION INDUSTRY CO., LTD., New Taipei (TW)

(72) Inventor: I-Thun Lin, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 447 days.

(21) Appl. No.: 13/740,281

(22) Filed: Jan. 14, 2013

(65) Prior Publication Data

US 2014/0110568 A1 Apr. 24, 2014

(30) Foreign Application Priority Data

Oct. 22, 2012 (TW) .............................. 101138971 A

(51) Int. Cl.
*H01J 40/14* (2006.01)
*G02B 27/00* (2006.01)
*G01J 1/04* (2006.01)
*G01J 1/02* (2006.01)
*H01S 5/022* (2006.01)

(52) U.S. Cl.
CPC ............. *G01J 1/0403* (2013.01); *G01J 1/0271* (2013.01); *H01S 5/02248* (2013.01); *H01S 5/02288* (2013.01); *H01S 5/02292* (2013.01)

(58) Field of Classification Search
CPC ...................................................... H04B 1/587
USPC ............ 385/15, 24–26, 8, 14, 75; 341/13, 14; 398/202, 206, 209, 213; 250/551, 239, 250/208.1
See application file for complete search history.

(56) References Cited

U.S. PATENT DOCUMENTS

| 6,643,420 | B2 * | 11/2003 | Han et al. ........................ 385/14 |
| 6,868,207 | B2 * | 3/2005 | Wickman ........................ 385/37 |
| 7,441,965 | B2 * | 10/2008 | Furuno et al. .................. 385/93 |
| 2012/0104240 | A1 * | 5/2012 | Schunk .................... 250/227.24 |
| 2013/0315533 | A1 * | 11/2013 | Tay et al. ........................ 385/31 |

FOREIGN PATENT DOCUMENTS

WO WO2011/077723 * 6/2011 .............. G02B 6/42

* cited by examiner

*Primary Examiner* — Pascal M Bui Pho
(74) *Attorney, Agent, or Firm* — Novak Druce Connolly Bove + Quigg LLP

(57) ABSTRACT

An optical-electric converting module includes a printed circuit board (PCB), a bracket and an optical-electric coupling element. The PCB includes a supporting surface, at least one laser diode and at least one photo diode. The at least one laser diode and the at least one photo diode are positioned on the supporting surface and electrically connected to the PCB. The bracket includes a first surface and a second surface facing away from the first surface. The first surface rests on the supporting surface. The bracket defines a through window running through the first surface and the second surface. The bracket is detachably connected to the supporting surface of the PCB, with the at least one laser diode and the at least one photo diode being received in the through window. The optical-electric coupling element is detachably connected to the second surface of the bracket.

16 Claims, 4 Drawing Sheets

PHOTO-ELECTRIC CONVERTING MODULE HAVING OPPOSITE CAVITIES

BACKGROUND

1. Technical Field

The present disclosure relates to optical-electric converting modules, and particularly to an optical-electric converting module which has a bracket.

2. Description of Related Art

An optical-electric converting module usually includes a circuit board, a number of light emitters, a number of light receivers, and a optical-electric coupling member. The light emitters and the light receivers are mounted on and electrically connected to the circuit board. The optical-electric coupling member includes a number of coupling lenses and is adhered to the circuit board by adhesive. Each of the light emitters and the light receivers is precisely aligned with a coupling lens. In use, light beams emitted by each light emitter project into the optical-electric coupling member through a coupling lens and are then emitted out from the optical-electric coupling member. External light beams are projected into the optical-electric coupling member, pass through a coupling lens, and are then projected into a light receiver. The optical-electric coupling member is adhered to the circuit board by the adhesive and the adhesive may not be strong enough to withstand shocks and jars, the optical-electric coupling member will readily shift when an external force is applied and misalignment between the coupling lenses and the light emitters and the light receivers is the result.

Therefore, it is desirable to provide an optical-electric converting module which can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
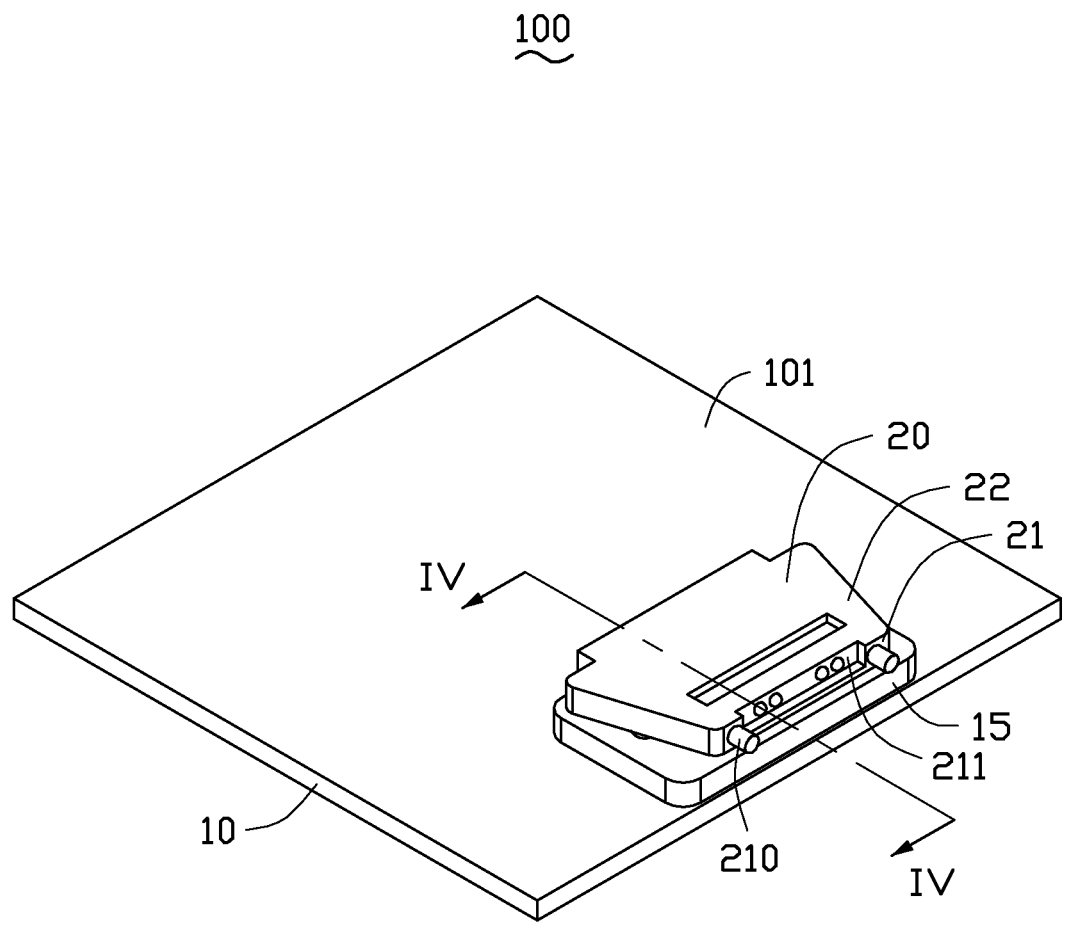
FIG. 1 is an isometric view of an optical-electric converting module, according to an exemplary embodiment.
Figure 2:
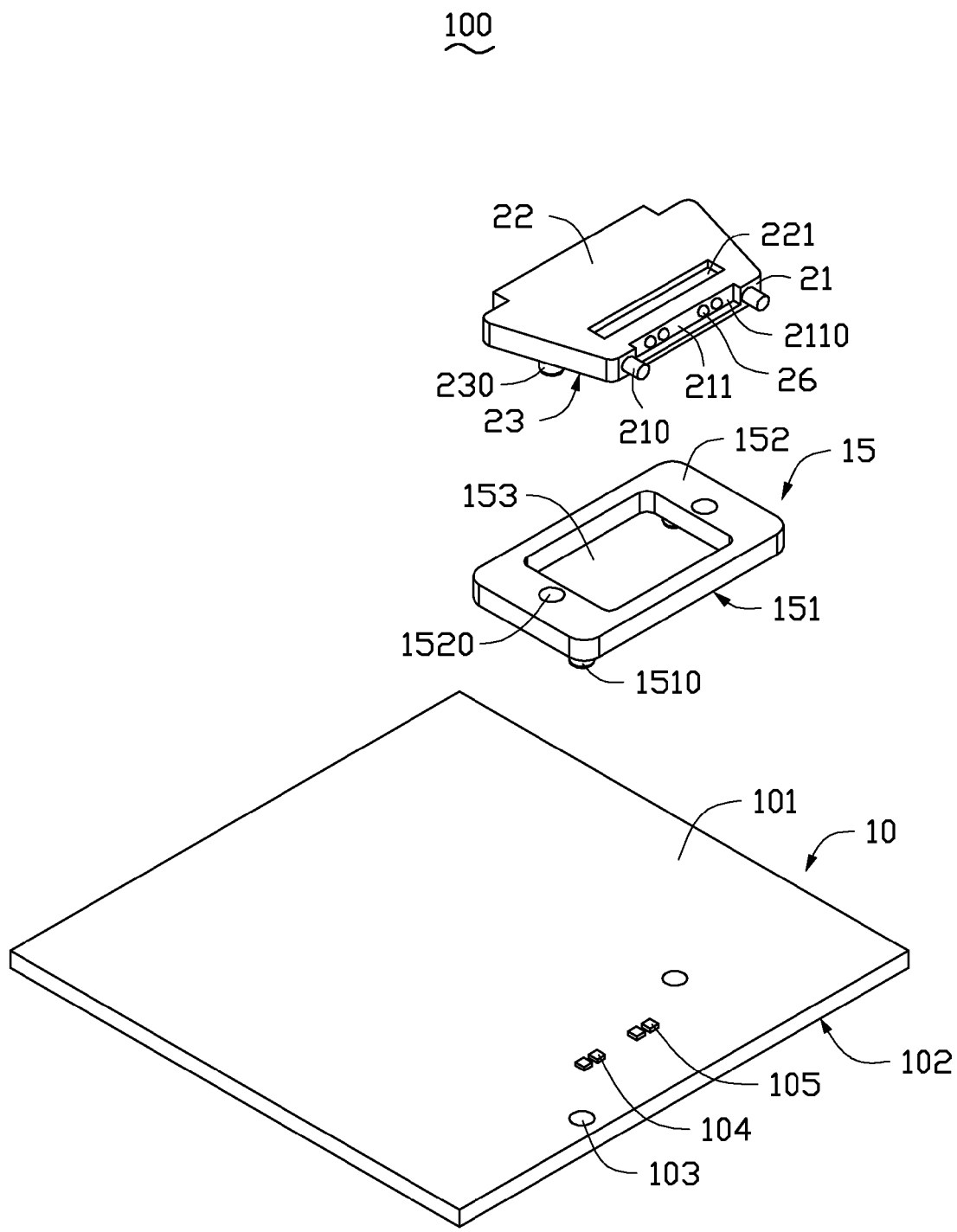
FIG. 2 is an exploded, isometric view of the optical-electric converting module of FIG. 1.
Figure 3:
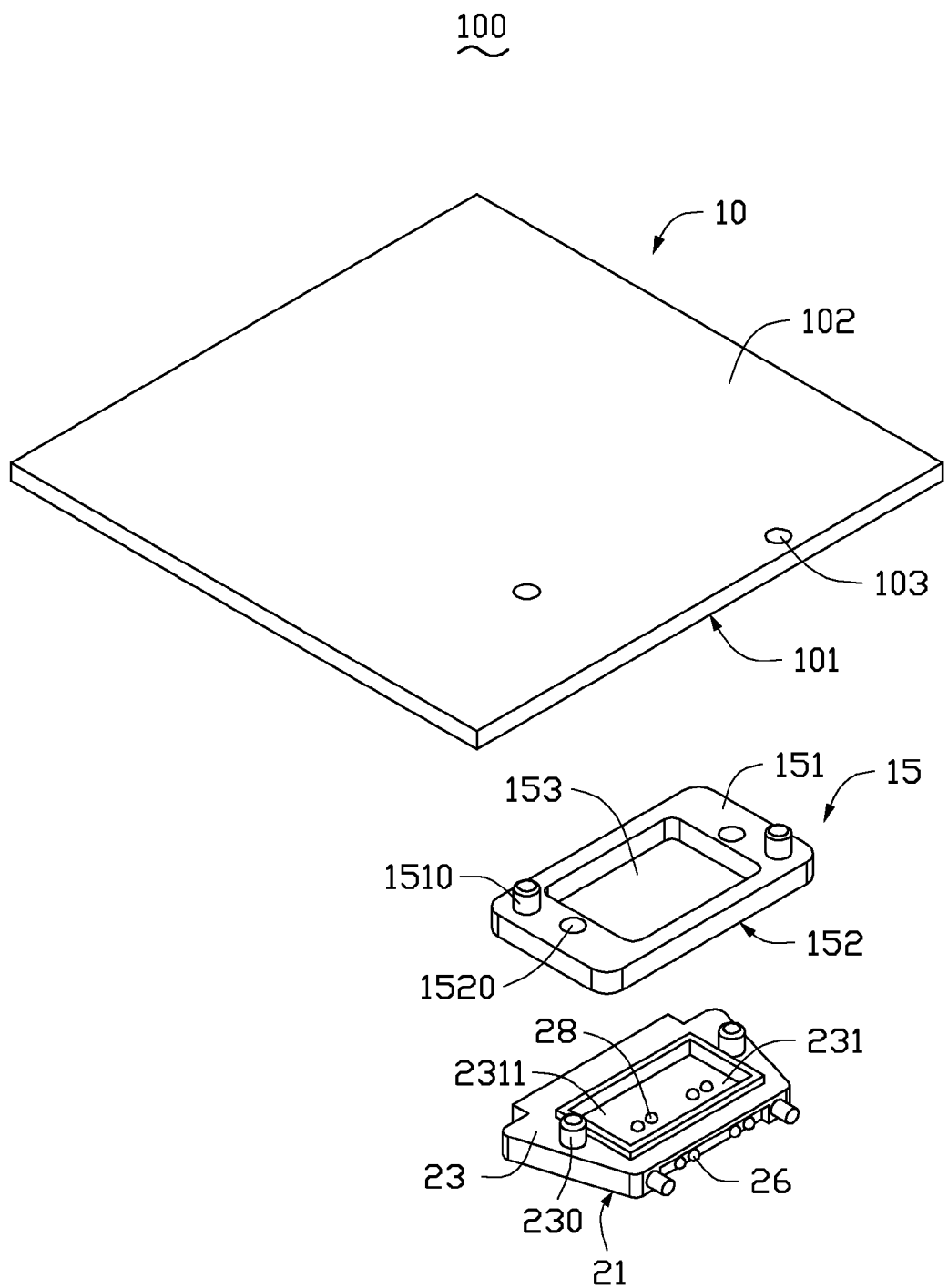
FIG. 3 is similar to FIG. 2, but viewed from another angle.
Figure 4:
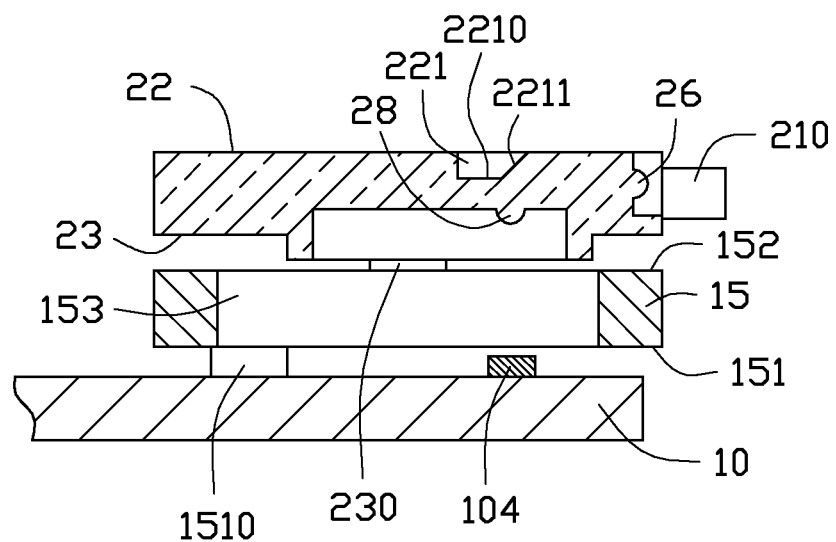
FIG. 4 is a cross-sectional view taken along line IV-IV of FIG. 1.

FIGS. 1-4 show an optical-electric converting module 100, according to an embodiment. The optical-electric converting module 100 includes a printed circuit board (PCB) 10, a bracket 15 and an optical-electric coupling element 20. The bracket 15 is detachably connected to the PCB 10. The optical-electric coupling element 20 is detachably connected to the bracket 15.

The PCB 10 includes a supporting surface 101 and a rear surface 102 facing away from the supporting surface 101. The PCB 10 defines two first locating holes 103 running through the supporting surface 101 and the rear surface 102. Four photoelectric conversion chips, such as two laser diodes 104 and two photo diodes 105, are positioned on the supporting surface 101. The PCB 10 contains various circuits (not shown) that connect with the two laser diodes 104 and the two photo diodes 105, to drive the laser diodes 104 to emit light, and for the demodulation of data in the light received by the photo diodes 105. In the embodiment, the two laser diodes 104 and the two photo diodes 105 are positioned between the two first locating holes 103.

The bracket 15 includes a first surface 151 and a second surface 152 facing away from the first surface 151. The bracket 15 defines a through window 153 running through the first surface 151 and the second surface 152. The first surface 151 rests on the supporting surface 101. The bracket 15 includes two first locating poles 1510 perpendicularly extending downwards from the first surface 151. The shape and size of the first locating poles 1510 correspond to the shape and size of the first locating holes 103. When assembling, the first locating poles 1510 are inserted into the first locating holes 103 as a pinch fit to firmly attach the bracket 15 onto the supporting surface 101 of the PCB 10, with the two laser diodes 104 and the two photo diodes 105 being received in the through window 153. When disassembling, the first locating poles 1510 are detached from the first locating holes 103 via pulling the bracket 15 along a direction away from the PCB 10 or pulling the PCB 10 along a direction away from the bracket 15.

In the embodiment, the first locating poles 1510 are integrally formed with the bracket 15. Alternatively, the first locating poles 1510 and the bracket 15 may be separately formed. The first locating poles 1510 can be attached to the bracket 15 by adhesive, plastic welding or other attaching method. All of the first locating poles 1510 have essentially identical height to promote even loading thereon.

The bracket 15 also defines two second locating holes 1520 running through the first surface 151 and the second surface 152.

The optical-electric coupling element 20 includes a first side surface 21, an upper surface 22 and a lower surface 23 facing away from the upper surface 22. The upper surface 22 is substantially parallel with the lower surface 21. The first side surface 21 perpendicularly connects the upper surface 22 and the lower surface 23. The optical-electric coupling element 20 defines a first cavity 231 in the lower surface 23. A bottom portion 2311 of the first cavity 231 forms four first coupling lenses 28. In the embodiment, all of the first coupling lenses 28 are convex lenses and are integrally formed with the optical-electric coupling element 20.

The optical-electric coupling element 20 includes two second locating poles 230 perpendicularly extending downwards from the lower surface 23. In the embodiment, the second locating poles 230 are symmetrical about the first cavity 231. The shape and size of the second locating poles 230 correspond to the shape and size of the second locating holes 1520. As such, when assembling, the second locating poles 230 are inserted into the second locating holes 1520 as a pinch fit to firmly attach the optical-electric coupling element 20 onto the bracket 15, with each of the first coupling lens 28 aligning with a laser diode 104 or a photo diode 105. When disassembling, the second locating poles 230 are detached from the second locating holes 1520 via pulling the optical-electric coupling element 20 along a direction away from the bracket 15 or pulling the bracket 15 along a direction away from the optical-electric coupling element 20.

In the embodiment, the second locating poles 230 are integrally formed with the optical-electric coupling element 20. Alternatively, the second locating poles 230 and the optical-electric coupling element 20 may be separately formed. The second locating poles 230 can be attached to the optical-electric coupling element 20 by adhesive, plastic welding or other attaching method. All of the second locating poles 230 have essentially identical height to promote even loading thereon.

The optical-electric coupling element 20 also defines a second cavity 221 in the upper surface 22. The second cavity 221 includes a bottom surface 2210 and a sloped surface 2211 directly connected to the bottom surface 2210. The bottom surface 2210 is substantially parallel with the upper surface 22. An included angle between the bottom surface 2210 and the sloped surface 2211 is about 45 degrees. An angle between an optical axis of each first coupling lens 28 and the sloped surface 2211 is therefore about 45 degrees.

The optical-electric coupling element 20 also defines a receiving cavity 211 in the first side surface 21. The receiving cavity 211 includes a vertical surface 2110 substantially perpendicular to the upper surface 22. The vertical surface 2110 forms four second coupling lenses 26. In the embodiment, all of the second coupling lenses 26 are convex lenses and are integrally formed with the optical-electric coupling element 20. Each of the second coupling lenses 26 corresponds to one of the first coupling lenses 28. Two positioning poles 210 perpendicularly extend upwards from the first side surface 21. In the embodiment, the two positioning poles 210 are symmetrical about the receiving cavity 211.

In use, light emitted from the two laser diodes 104 is directed into the optical-electric coupling element 20 by two of the first coupling lenses 28, and the light path is bent about 90 degrees by the sloped surface 2211. In the embodiment, the second coupling lenses 26 are positioned on the light path from the sloped surface 2211. As such, the light is finally reflected into the two optical fibers (not shown) by the second coupling lenses 26. A process of the photo diodes 105 receiving light is the reverse of that of the laser diodes 104 emitting light.

In other embodiments, the numbers of the laser diodes 104, the photo diodes 105, the first coupling lenses 28 and the second coupling lenses 26 can be changed depending on need.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the possible scope of the disclosure but do not restrict the scope of the disclosure.

What is claimed is:

1. An optical-electric converting module, comprising:
   a printed circuit board (PCB) comprising a supporting surface, at least one laser diode and at least one photo diode, the at least one laser diode and the at least one photo diode positioned on the supporting surface and electrically connected to the PCB;
   a bracket comprising a first surface and a second surface facing away from the first surface, the first surface resting on the supporting surface, the bracket defining a through window running through the first surface and the second surface, the bracket detachably connected to the supporting surface of the PCB, with the at least one laser diode and the at least one photo diode being received in the through window; and
   an optical-electric coupling element detachably connected to the second surface of the bracket, and comprising a lower surface and an upper surface facing away from the lower surface, the upper surface being substantially parallel with the lower surface, the optical-electric coupling element defining a first cavity in the lower surface, and a second cavity in the upper surface, the second cavity comprising a bottom surface and a sloped surface directly connected to the bottom surface, the bottom surface being substantially parallel with the upper surface, and an included angle between the bottom surface and the sloped surface being about 45 degrees; wherein the PCB comprises a rear surface facing away from the supporting surface, the PCB defines two first locating holes running through the supporting surface and the rear surface, the bracket comprises two first locating poles perpendicularly extending downwards from the first surface, and the first locating poles are inserted into the first locating hole as a pinch fit to firmly attach the bracket onto the PCB; the bracket defines two second locating holes running through the first surface and the second surface, the optical-electric coupling element comprises a lower surface, the optical-electric coupling element comprises two second locating poles perpendicularly extending downwards from the lower surface, and the second locating poles are inserted into the second locating holes as a pinch fit to firmly attach the optical-electric coupling element onto the second surface of the bracket.

2. The optical-electric converting module of claim 1, wherein the at least one laser diode and the at least one photo diode are positioned between the two first locating holes.

3. The optical-electric converting module of claim 1, wherein the first locating poles are capable of being detached from the first locating holes via pulling the bracket along a direction away from the PCB or pulling the PCB along a direction away from the bracket.

4. The optical-electric converting module of claim 1, wherein the first locating poles are integrally formed with the bracket.

5. The optical-electric converting module of claim 1, wherein the first locating poles are attached to the bracket.

6. The optical-electric converting module of claim 1, wherein the second locating poles are capable of being detached from the second locating holes via pulling the optical-electric coupling element along a direction away from the bracket or pulling the bracket along a direction away from the optical-electric coupling element.

7. The optical-electric converting module of claim 1, wherein the second locating poles are integrally formed with the optical-electric coupling element.

8. The optical-electric converting module of claim 1, wherein the second locating poles are attached to the optical-electric coupling element.

9. The optical-electric converting module of claim 1, wherein a bottom portion of the first cavity forms at least two first coupling lenses, and each of the at least two first coupling lenses aligning with a respective one of the at least one laser diode and the at least one photo diode.

10. The optical-electric converting module of claim 9, wherein all of the at least two first coupling lenses are convex lenses and are integrally formed with the optical-electric coupling element.

11. The optical-electric converting module of claim 9, wherein an angle between an optical axis of each first coupling lens and the sloped surface is about 45 degrees.

12. The optical-electric converting module of claim 9, wherein the optical-electric coupling element comprises a side surface, the side surface perpendicularly connects the upper surface and the lower surface, the optical-electric coupling element defines a receiving cavity in the side surface, the receiving cavity comprises a vertical surface substantially perpendicular to the upper surface, the vertical surface forms at least two second coupling lenses, and each of the at least two second coupling lenses corresponds to a respective one of the at least two first coupling lenses.

13. The optical-electric converting module of claim 12, wherein the at least two second coupling lenses are positioned on a light path of the sloped surface.

14. The optical-electric converting module of claim 12, wherein all of the at least two second coupling lenses are convex lenses and are integrally formed with the optical-electric coupling element.

15. The optical-electric converting module of claim 12, wherein the optical-electric coupling element comprises two positioning poles perpendicularly extending from the side surface.

16. The optical-electric converting module of claim 15, wherein the two positioning poles are symmetrical about the receiving cavity.

\* \* \* \* \*